United States Patent
Tsai et al.

(10) Patent No.: US 9,496,231 B1
(45) Date of Patent: Nov. 15, 2016

(54) BYPASS RING TO IMPROVE NOISE ISOLATION OF COILS AND INDUCTORS

(71) Applicant: Intel IP Corporation, Santa Clara, CA (US)

(72) Inventors: Chi-Taou Robert Tsai, Chandler, AZ (US); Curtiss D. Roberts, Chandler, AZ (US); Lillian G. Lent, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/958,365

(22) Filed: Dec. 3, 2015

(51) Int. Cl.
| | | |
|---|---|---|
| *H01L 23/58* | (2006.01) | |
| *H01L 23/66* | (2006.01) | |
| *H01L 23/522* | (2006.01) | |
| *H01L 49/02* | (2006.01) | |
| *H04B 1/40* | (2015.01) | |
| *H04B 1/26* | (2006.01) | |

(52) U.S. Cl.
CPC ......... *H01L 23/585* (2013.01); *H01L 23/5227* (2013.01); *H01L 23/66* (2013.01); *H01L 28/10* (2013.01); *H04B 1/26* (2013.01); *H04B 1/40* (2013.01); *H01L 2223/6677* (2013.01)

(58) Field of Classification Search
CPC .................................................... H01L 23/585
See application file for complete search history.

(56) References Cited

U.S. PATENT DOCUMENTS

| | | | | |
|---|---|---|---|---|
| 7,898,056 B1* | 3/2011 | Keramat | ............... | H01L 23/564 257/170 |
| 7,977,762 B1* | 7/2011 | Keramat | ............... | H01L 23/564 257/202 |
| 2004/0056689 A1* | 3/2004 | Stengel | ................... | H03F 3/605 327/1 |
| 2009/0127652 A1* | 5/2009 | Ding | ....................... | H01L 21/76 257/508 |
| 2013/0285203 A1* | 10/2013 | Hiroi | ....................... | H01L 28/40 257/532 |
| 2014/0070366 A1* | 3/2014 | Yen | .................... | H01L 29/66181 257/532 |
| 2014/0167292 A1* | 6/2014 | Masumura | ............. | H01L 24/48 257/784 |
| 2014/0281810 A1* | 9/2014 | Gifford | ................. | G06F 11/106 714/764 |

\* cited by examiner

*Primary Examiner* — David Bilodeau
(74) *Attorney, Agent, or Firm* — Schwegman Lundberg & Woessner, P.A.

(57) ABSTRACT

An integrated circuit (IC) comprises a plurality of metal layers; a seal ring arranged around a perimeter of the IC and included in at least a portion of the plurality of metal layers; a first coil included in the IC; and a bypass conductor included in at least one metal layer of the plurality of metal layers and having at least a first end and a second end electrically coupled to the seal ring to form a bypass ring around the first coil.

25 Claims, 6 Drawing Sheets

US 9,496,231 B1

BYPASS RING TO IMPROVE NOISE ISOLATION OF COILS AND INDUCTORS

TECHNICAL FIELD

Embodiments pertain to designing of integrated circuits. Some embodiments relate to reducing noise in integrated circuit die.

BACKGROUND

Electronic devices typically include one or more integrated circuit (IC) die. The demand for increased functionality in small consumer products such as smartphones and tablet computers drives leads manufacturers to strive for decreased feature sizes of ICs and increased circuit complexity and density. One of the challenges in designing high density integrated circuits is the problem of crosstalk between circuits. As circuits are laid out closer together on an IC die, the possibility of noise from crosstalk increases. A challenge to implementing carrier aggregation is the problem of crosstalk between the frequency channels during the simultaneous operation of the channels. Thus, there are general needs for devices, systems and methods that provide the desired functionality of the IC circuits and minimize circuit crosstalk.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The demand for increased functionality in smaller electronic devices causes challenges for IC designers. For example, it may be necessary for high frequency switching circuits to reside on the same IC die as circuits that are noise sensitive, which can lead to problems of cross talk between circuits.

A seal ring is a structure for placement in the perimeter of an IC die. The seal ring is sometimes called an edge seal and may be fabricated during the wafer fabrication process. The function of a seal ring is to protect the IC die from damage during dicing of the wafer to prevent chipping and the propagation of cracks into circuits of the IC die. A seal ring may be formed as continuous rings in metal layers arranged around the outside of the IC die. In certain embodiments, the seal ring is included in all metal layers available in the fabrication process. All the rings of the seal ring are electrically shorted together, such as by vias between metal layers formed along the lengths of the rings for example. In certain embodiments, a ring of the seal can be nearly continuous and include a small gap in the ring formed in a metal layer.

In ICs with circuits designed to operate at high frequencies (e.g., RF frequencies), the seal ring can present signal integrity issues. If a circuit that is a source of noise (an "aggressor" circuit) is positioned near the seal ring, the noise source circuit can induce sizable noise current in the seal ring that may then propagate along the seal ring to other parts of the IC. This noise current may couple into a noise sensitive circuit (a "victim" circuit) causing undesirable noise.

The amount of undesired signal or noise transferred between a circuit and the seal ring can be dependent upon the magnetic coupling between the circuit and the ring. Some examples of noise source circuit elements include an inductor coil, a balun, a transformer, or similar structure typically comprising metal. Noise sensitive circuits may include similar circuit elements. Significant coupling between the seal ring and the noise source and noise sensitive circuits occurs when such circuits are positioned in close proximity to the seal ring. Because of the increasing circuit density of ICs, arranging such circuits near the seal ring may be unavoidable.

Figure 1:
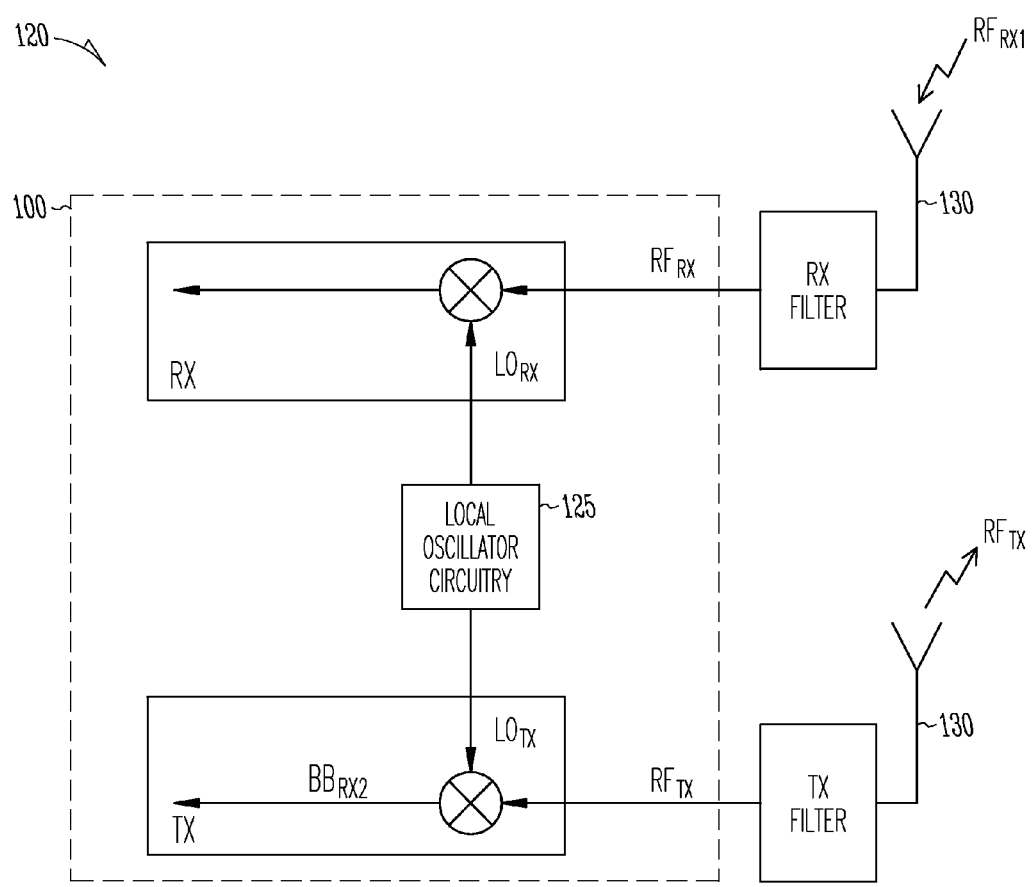
FIG. 1 is a block diagram of portions of a radio frequency transceiver in accordance with some embodiments.

FIG. 1 is a block diagram of portions of an RF transceiver 120 for an RF communication device. The RF transceiver 120 includes an IC 100 having one or both of an RF receiver (RX) and an RF transmitter (TX). The IC 100 includes local oscillator circuitry 125 for one or both of the RF receiver and RF transmitter. One or more antennas 130 can be conductively coupled to the RF transceiver 120. The local oscillator circuitry 125 may generate a local oscillator signal used for mixing a received RF signal, such as by down-mixing received RF signals using a frequency of the local oscillator circuit for example.

Figure 2:
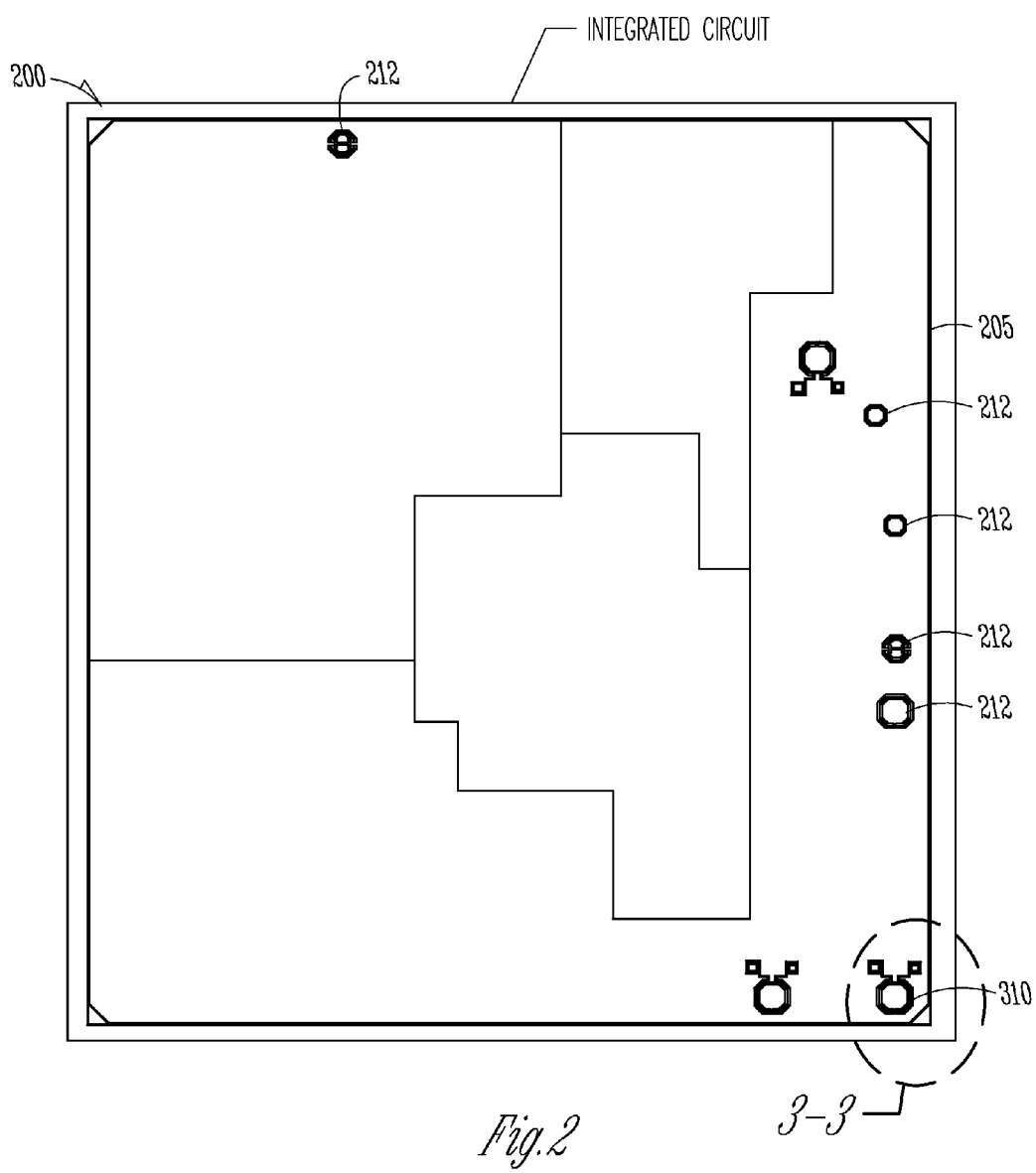
FIG. 2 shows an example of an integrated circuit that includes a radio frequency transceiver circuit in accordance with some embodiments.

FIG. 2 shows an example of an IC that includes an RF transceiver circuit. The IC 200 includes a seal ring 205 arranged around a perimeter of the IC 200. The seal ring 205 is formed in metal layers of the IC. In certain embodiments, the seal ring 205 is included in all of the metal layers of the IC, and in certain embodiments, the seal ring 205 is included in a portion of the metal layers of the IC. The IC 200 includes a coil 310 shown within the region labeled 3-3. This coil may be sensitive to noise. An example of a noise sensitive coil is an inductor coil for the local oscillator circuitry of the RF receiver of FIG. 1.

The IC 200 may also include a circuit element that is a source of signal noise. An example of a noise source is a second coil or second inductor used in a switching power supply. Another example of a noise is a balun or transformer formed in the IC. Still another example is a conductive trace (e.g., a metal or polysilicon trace) of the IC that conducts or carries a clock signal. The switching of the clock signal can couple to the seal ring 205. In the example of FIG. 2, the IC 200 includes noise sources 212 arranged near the seal ring

205. The position of the noise sources relative to the seal ring may cause unwanted coupling of noise with the first coil 210.

Figure 3:
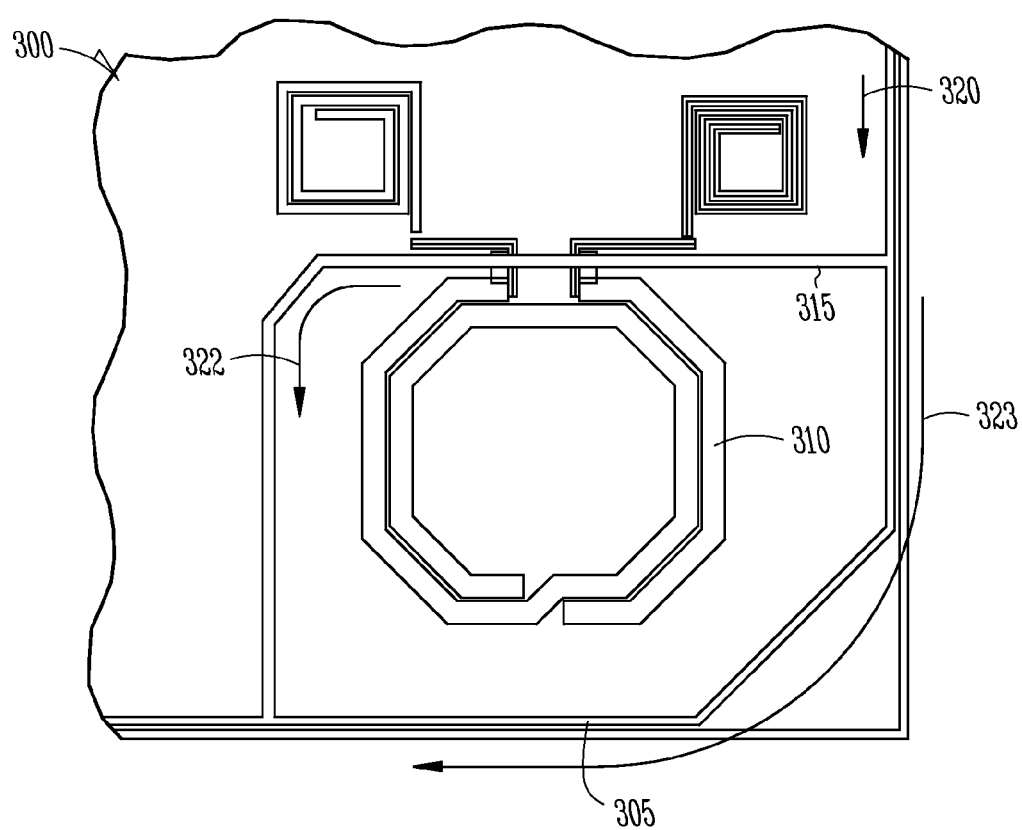
FIG. 3 shows a portion of an example of an integrated circuit and a portion of the seal ring of the integrated circuit in accordance with some embodiments.

FIG. 3 is an enlarged view of a portion of the IC of the example of FIG. 2 (labeled as 3-3 in FIG. 2) and a portion of the seal ring 305 of the IC. The IC includes a bypass conductor 315 having a first end and a second end electrically coupled to the seal ring 305. The bypass conductor 315 can be included in one or more metal layers of the IC. In certain embodiments, the bypass conductor 315 is included in all metal layers of the IC. In certain embodiments, the seal ring 305 is included in a portion of the metal layers of the IC, and the bypass conductor 315 is included in metal layers that are different from the metal layers that include the seal ring 305. In certain embodiments, the bypass conductor 315 is included in a re-distribution layer (RDL) instead of metal layers of the IC. The RDL layers refer to metal layers formed after the IC fabrication process. RDL layers such as wafer-level chip scale re-distribution layers (WLCSP RDL) may be added as part of IC packaging. The bypass conductor 315 and the seal ring 305 form a bypass ring around the first coil 310. The noise sensitive first coil 310 is positioned within the bypass ring and the noise sources are positioned outside the bypass ring.

In FIG. 3, arrow 320 indicates noise current in the seal ring. At the junction of the bypass conductor 315 and the seal ring 305, the noise current splits (as shown by arrows 322, 323) so that part of the noise current flows through the bypass conductor 315 and part of the noise current flows through a portion of the seal ring 305. If the impedance of the bypass conductor 315 is equal to the impedance of the portion of the seal ring electrically coupled to the first end and the second end of the bypass conductor, the noise current is in the two branches will be equal. The impedance of the bypass conductor can be changed by changing the width of the metal layers of the bypass conductor. Reasonably good matching will occur when the impedance of the bypass conductor is substantially equal to the impedance of the portion of the seal ring included in the bypass ring. In certain embodiments, the impedance of the bypass conductor is within five to ten percent of the impedance of the portion of the seal ring.

As shown by the arrows, the noise current in FIG. 3 flows clockwise through the seal ring portion of the bypass ring and counter-clockwise through the bypass portion of the bypass ring. This results in the polarity of the magnetic field (or H-field) induced by the current of the bypass conductor being opposite in polarity to the magnetic field induced by the seal ring portion. Therefore, the fields cancel in the area of the first coil 310 and the noise coupling to the first coil 310 is reduced.

Figure 4:
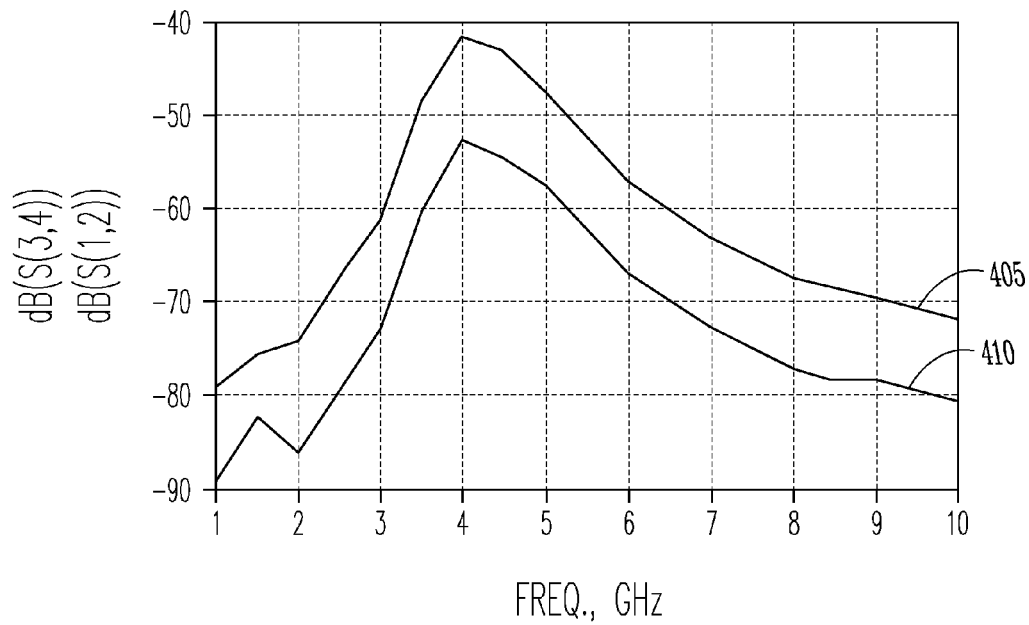
FIG. 4 is a graph of examples of noise from a noise source coil coupling to a noise sensitive coil in accordance with some embodiments.

FIG. 4 is a graph showing examples of noise from a noise source coil coupling to a noise sensitive coil. The noise source coil and the noise sensitive coil were both formed in an IC near a seal ring. The waveforms in the graph show coupling noise versus frequency. Waveform 405 shows noise level versus frequency for the noise sensitive coil without a bypass ring. Waveform 410 shows noise versus frequency for the noise sensitive coil when it is placed within a bypass ring. The waveforms show that the noise decreased about 12 decibels (dB) at 4 gigahertz (4 GHz) when a bypass ring is used. Therefore, coil-to-coil noise coupling can be reduced by the bypass ring. The waveforms include a peak near 4 gigahertz (4 GHz) because the noise sensitive coil was designed to resonate at that frequency, and peak coupling of the noise source occurs at the resonant frequency.

Returning to FIG. 3, the example in the Figure shows the noise sensitive coil located in a corner of the IC 300. The bypass "ring" has a substantially rectangular shape. The bypass conductor 315 comprises two sides of the bypass ring and the seal ring 305 comprises two sides of the bypass ring. Other arrangements maybe useful. For example, in other embodiments the bypass conductor 315 may comprise three sides of the bypass ring with the seal ring 305 comprising one side of the bypass ring. In this arrangement, the seal ring of the one-side may have a lower impedance than the bypass conductor on the three sides of the bypass ring. The bypass conductor 315 may be designed to have lower impedance when it comprises three sides of the bypass ring compared to the two-sided arrangement.

Figure 5:
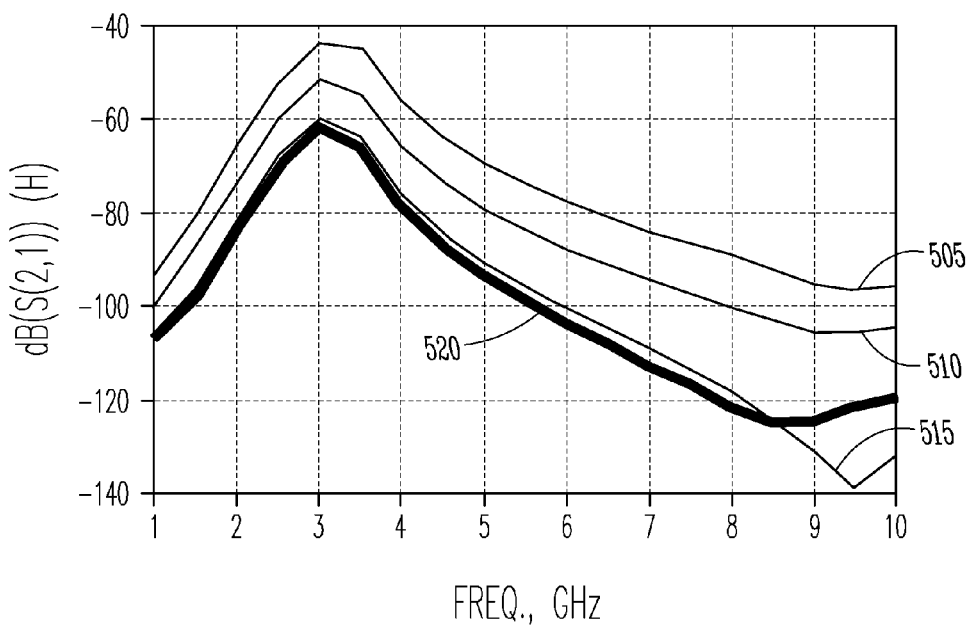
FIG. 5 is a graph showing additional examples of noise from a noise source coil coupling to a noise sensitive coil in accordance with some embodiments.

FIG. 5 is a graph showing additional examples of noise from a noise source coil coupling to a noise sensitive coil. Waveform 505 shows noise level versus frequency for the noise sensitive coil without a bypass ring. The other waveforms correspond to bypass ring embodiments where the bypass conductor forms three sides of the bypass ring. Waveforms 510, 515, and 520 correspond to the bypass conductor of the bypass ring having widths of 2 micrometers (µm), 4 µm, and 6 µm, respectively. The graphs show the noise coupling at 3 Ghz is reduced as the impedance more closely matches the impedance of the seal ring portion to provide better canceling of the magnetic fields.

Returning to FIG. 3, the seal ring 305 of the IC can include multiple connections or ties to electrical ground. In certain embodiments, all metals layers of the seal ring include a connection to electrical ground. The IC can be packaged in an IC package that includes a ground plane built into the IC package. In certain embodiments, the seal ring 305 includes low impedance electrical connections to the ground plane of the IC package. In certain examples, the IC can be packaged in an IC package that does not include a ground plane and the seal ring 305 includes low impedance electrical connections to an electrical ground connection of the IC.

Figure 6:
FIG. 6 is a graph showing additional examples of noise from a noise source coil coupling to a noise sensitive coil in accordance with some embodiments.

FIG. 6 is a graph showing additional examples of noise from a noise source coil coupling to a noise sensitive coil. Waveform 605 shows noise level versus frequency for the noise sensitive coil without a bypass ring. Waveform 610 shows noise versus frequency for the noise sensitive coil when it is placed within a bypass ring. Waveform 615 shows noise level versus frequency for the noise sensitive coil without a bypass ring and the seal ring includes multiple ties to electrical ground. Waveform 620 shows noise level versus frequency for the noise sensitive coil without a bypass ring and the seal ring includes multiple ties to electrical ground. The waveform 620 shows that the noise decreased from −42 dB at 4 GHz without a bypass ring and without ground ties on the seal ring to about −85 dB at 4 GHz when both a bypass ring and a seal ring with ground ties are used. The bypass ring can provide noise protection when ground ties to the seal ring are not available.

Figure 7:
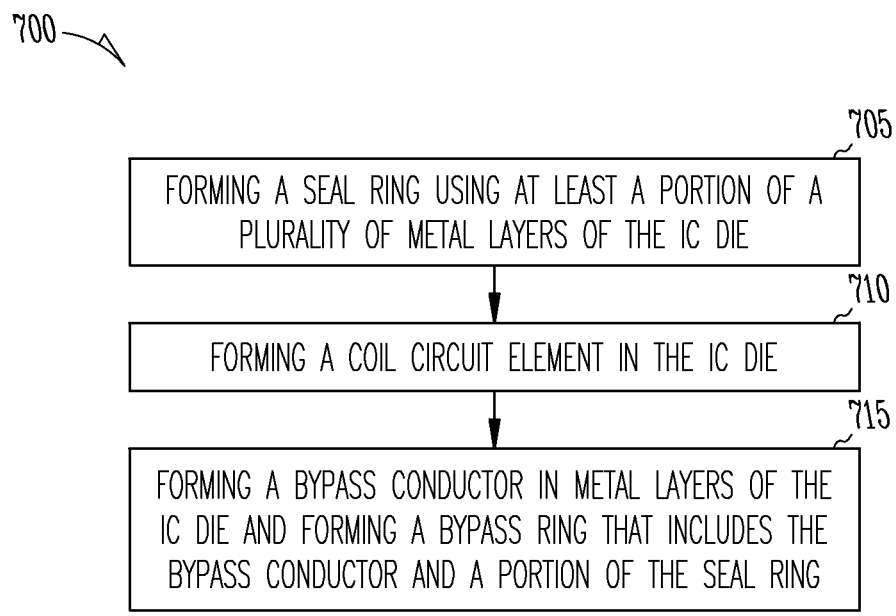
FIG. 7 is a flow diagram of a method of making an integrated circuit die in accordance with some embodiments.

FIG. 7 is a flow diagram of a method 700 of making an IC die. At 705, a seal ring is formed in the die using at least a portion of a plurality of metal layers of the IC die. The seal ring can be arranged around a perimeter of the IC die near an outer edge of the IC die. In certain embodiments, the seal ring is formed using all of the metal layers of the IC die.

At 710, an electronic coil circuit element is formed in the IC die. In some embodiments, a local oscillator circuit of an RF receiver is formed in the IC die, and the coil circuit element is an inductor coil included in the local oscillator circuit.

At 715, a bypass conductor is formed in at least one metal layer of the plurality of metal layers of the IC die. In some embodiments, the bypass conductor is formed using all the metal layers of the IC die. The bypass conductor has a first end and a second end that are electrically connected to the seal ring. The bypass conductor is arranged to form a bypass ring that includes the bypass conductor and a portion of the seal ring. In some embodiments, the bypass conductor is formed to have an impedance substantially equal to the impedance of the portion of the seal ring that is electrically coupled between the first end and second ends of the bypass conductor.

In some embodiments, one or more circuits that source noise are formed in the IC and positioned external to the bypass ring and the first coil is positioned within the bypass ring. The certain embodiments, the noise source circuits may include one or more of a second inductor, a balun and a transformer. In certain embodiments, a conductive trace for electrical coupling to a clock circuit is formed in the IC. The conductive trace is positioned external to the bypass ring and within the seal ring.

In certain embodiments, a plurality of electrical connections between the seal ring and electrical ground. The electrical connections may be low impedance connections (e.g., low impedance vias) to a ground plane included in an IC package or low impedance connections to electrical circuit ground of the IC. In certain embodiments, the seal ring is not grounded.

The devices, systems, and methods described that use a bypass ring in an IC can allow for reduced noise coupling for noise-sensitive circuits. Although some embodiments describe the IC used in an RF communication device, the IC bypass ring can be used in any application that uses microwave signals. Using a bypass ring can reduce noise coupling caused by a seal ring even when electrical grounding of the seal ring is unavailable in the IC fabrication process or is undesired for RF circuit design reasons.

ADDITIONAL DESCRIPTION AND EXAMPLES

Example 1 can include subject matter (such as an IC) comprising a plurality of metal layers; a seal ring arranged around a perimeter of the IC and disposed in at least a portion of the plurality of metal layers; a first coil included in the IC; and a bypass conductor disposed in at least one metal layer of the plurality of metal layers and having at least a first end and a second end electrically coupled to the seal ring to form a bypass ring around the first coil In Example 2, the subject matter of Example 1 optionally includes at least one of a second coil, a balun, and a transformer disposed outside the bypass ring and the first coil disposed within the bypass ring.

In Example 3, the subject matter of one or both of Examples 1 and 2 optionally includes a conductive trace configured to conduct a clock signal, wherein the conductive trace is disposed outside the bypass ring and the first coil positioned within the bypass ring.

In Example 4, the subject matter of one or any combination of Examples 1-3 optionally includes the first coil being a first inductor coil disposed within the bypass ring and is disposed in a local oscillator circuit of a radio frequency receiver, and wherein the IC includes a second inductor coil disposed outside the bypass ring and within the seal ring.

In Example 5, the subject matter of one or any combination of Examples 1-4 optionally includes the IC in an IC die and wherein the seal ring is disposed in all metal layers of the plurality of metal layers of the IC and is continuous around an outer edge of the IC die.

In Example 6, the subject matter of one or any combination of Examples 1-5 optionally includes a seal that ring includes a plurality of electrical connections to electrical ground.

In Example 7, the subject matter of one or any combination of Examples 1-4 and 6 optionally includes the bypass conductor being included in metal layers of the IC that are different from the metal layers that include the seal ring.

In Example 8, the subject matter of one or any combination of Examples 1-7 optionally includes the impedance of the bypass conductor being substantially equal to the impedance of a portion of the seal ring electrically coupled to the first end and the second end of the bypass conductor.

In Example 9, the subject matter of one or any combination of Examples 1-8 optionally includes the bypass ring having a substantially rectangular shape, and the bypass conductor comprises two sides of the bypass ring and the seal ring comprises two sides of the bypass ring.

In Example 10, the subject matter of one or any combination of Examples 1-8 optionally includes the bypass ring having a substantially rectangular shape, and the bypass conductor comprises three sides of the bypass ring and the seal ring comprises one side of the bypass ring.

Example 11 can include subject matter (such as an apparatus of an RF communication device), or can be combined with the subject matter of one or any combination of Examples 1-10 to include such subject matter, comprising an RF transceiver including an integrated circuit (IC). The IC optionally includes a plurality of metal layers; a seal ring arranged in at least a portion of the plurality of metal layers around a perimeter of the IC; a local oscillator circuit that includes a first inductor coil formed within the seal ring, wherein the RF transceiver is configured to down-mix received RF signals using a frequency of the local oscillator; and a bypass conductor disposed in at least one metal layer of the plurality of metal layers and having at least a first end and a second end electrically coupled to the seal ring to form a bypass ring around the first coil.

In Example 12, the subject matter of Example 11 optionally includes an IC that includes at least one of a second coil, a balun, and a transformer arranged within the seal ring and outside the bypass ring.

In Example 13, the subject matter of one or both of Examples 11 and 12 optionally includes an IC including a conductive trace configured to conduct a clock signal arranged within the seal ring and outside the bypass ring.

In Example 14, the subject matter of one or any combination of Examples 11-13 optionally includes a bypass ring comprising one or more metal layers that are different from metal layers used to form the seal ring.

In Example 15, the subject matter of one or any combination of Examples 11-14 optionally includes the bypass conductor having an impedance substantially equal to the impedance of a portion of the seal ring electrically coupled to the first end and the second end of the bypass conductor.

In Example 16, the subject matter of one or any combination of Examples 11-13 and 15 optionally includes the seal ring disposed in all metal layers of the plurality of metal layers, is continuous around an outer edge of the IC, and includes a plurality of electrical connections to a ground plane.

In Example 17, the subject matter of one or any combination of Examples 11-16 optionally includes a bypass ring having a substantially rectangular shape and the bypass conductor comprises two or three sides of the bypass ring and the seal ring comprises the remaining sides of the bypass ring.

In Example 18, the subject matter of one or any combination of Examples 11-17 optionally includes one or more antennas conductively coupled to the RF transceiver.

Example 19 can include subject matter, such as a method of making an IC die, or can optionally be combined with the subject matter of one or any combination of Examples 1-18 to include such subject matter, comprising forming a seal ring using at least a portion of a plurality of metal layers of the IC die, wherein the seal ring is arranged around a perimeter of the IC die near an outer edge of the IC die; forming a first coil in the IC die; and forming a bypass conductor in at least one metal layer of the plurality of metal layers of the IC die and having a first end and a second end, wherein the first end and the second end of the bypass conductor are electrically connected to the seal ring, and the bypass conductor is arranged to form a bypass ring that comprises the bypass conductor and a portion of the seal ring.

In Example 20, the subject matter of Example 19 optionally includes forming at least one of a second coil, a balun, and a transformer within the seal ring of the IC die and outside the bypass ring of the IC die.

In Example 21, the subject matter of one or both of Examples 19 and 20 optionally includes forming a conductive trace for electrical coupling to a clock circuit within the seal ring of the IC die and outside the bypass ring of the IC die.

In Example 22, the subject matter of one or any combination of Examples 19-21 optionally includes forming a local oscillator circuit of a radio frequency receiver in the IC die, wherein the local oscillator circuit includes the first coil as an inductor coil included in the local oscillator circuit.

In Example 23, the subject matter of one or any combination of Examples 19-22 optionally includes forming the seal ring in all metal layers of the plurality of metal layers and continuous around the outer edge of the IC die.

In Example 24, the subject matter of one or any combination of Examples 19-22 optionally includes forming the bypass conductor using one or more metal layers that are different from metal layers used to form the seal ring.

In Example 25, the subject matter of one or any combination of Examples 19-24 optionally includes forming the bypass conductor to have an impedance substantially equal to the impedance of a portion of the seal ring electrically coupled to the first end and the second end of the bypass conductor.

In Example 26, the subject matter of one or any combination of Examples 19-25 optionally includes forming a plurality of electrical connections between the seal ring and electrical ground.

In Example 27, the subject matter of one or any combination of Examples 19-26 optionally includes forming the bypass ring to have a substantially rectangular shape, and forming the bypass conductor as two sides of the bypass ring and the seal ring as two sides of the bypass ring.

In Example 28, the subject matter of one or any combination of Examples 19-26 optionally includes forming the bypass ring to have a substantially rectangular shape, and forming the bypass conductor as three sides of the bypass ring and the seal ring as one side of the bypass ring.

These non-limiting examples can be combined in any permutation or combination.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An integrated circuit (IC) comprising:
   a plurality of metal layers;
   a seal ring arranged around a perimeter of the IC and disposed in at least a portion of the plurality of metal layers;
   a first coil included in the IC; and
   a bypass conductor disposed in at least one metal layer of the plurality of metal layers and having at least a first end and a second end electrically coupled to the seal ring to form a bypass ring around the first coil.

2. The IC of claim 1, including at least one of a second coil, a balun, and a transformer disposed outside the bypass ring and the first coil disposed within the bypass ring.

3. The IC of claim 1, including a conductive trace configured to conduct a clock signal, wherein the conductive trace is disposed outside the bypass ring and the first coil disposed within the bypass ring.

4. The IC of claim 1, wherein the first coil is a first inductor coil disposed within the bypass ring and is disposed in a local oscillator circuit of a radio frequency receiver, and wherein the IC includes a second inductor coil disposed outside the bypass ring and within the seal ring.

5. The IC of claim 1, wherein the IC is included in an IC die and wherein the seal ring is disposed in all metal layers of the plurality of metal layers of the IC and is continuous around an outer edge of the IC die.

6. The IC of claim 1, wherein the seal ring includes a plurality of electrical connections to electrical ground.

7. The IC of claim 1, wherein the bypass conductor is included metal layers that are different from metal layers that include the seal ring.

8. The IC of claim 1, wherein an impedance of the bypass conductor is substantially equal to the impedance of a portion of the seal ring electrically coupled to the first end and the second end of the bypass conductor.

9. The IC of claim 1, wherein the bypass ring has a substantially rectangular shape and the bypass conductor comprises two sides of the bypass ring and the seal ring comprises two sides of the bypass ring.

10. The IC of claim 1, wherein the bypass ring has a substantially rectangular shape and the bypass conductor comprises three sides of the bypass ring and the seal ring comprises one side of the bypass ring.

11. An apparatus of a radio frequency (RF) communication device, the apparatus comprising:
    an RF transceiver including an integrated circuit (IC), wherein the IC includes:
    a plurality of metal layers;
    a seal ring arranged in at least a portion of the plurality of metal layers around a perimeter of the IC;
    a local oscillator circuit that includes a first inductor coil formed within the seal ring, wherein the RF transceiver is configured to down-mix received RF signals using a frequency of the local oscillator circuit; and
    a bypass conductor disposed in at least one metal layer of the plurality of metal layers and having at least a first end and a second end electrically coupled to the seal ring to form a bypass ring around the first coil.

12. The apparatus of claim 11, wherein the IC includes at least one of a second coil, a balun, and a transformer arranged within the seal ring and outside the bypass ring.

13. The apparatus of claim 11, wherein the IC includes a conductive trace configured to conduct a clock signal arranged within the seal ring and outside the bypass ring.

14. The apparatus of claim 11, wherein the bypass ring comprises one or more metal layers that are different from metal layers used to form the seal ring.

15. The apparatus of claim 11, wherein an impedance of the bypass conductor is substantially equal to the impedance of a portion of the seal ring electrically coupled to the first end and the second end of the bypass conductor.

16. The apparatus of claim 11, wherein the seal ring is disposed in all metal layers of the plurality of metal layers, is continuous around an outer edge of the IC, and includes a plurality of electrical connections to a ground plane.

17. The apparatus of claim 11, wherein the bypass ring has a substantially rectangular shape and the bypass conductor comprises two or three sides of the bypass ring and the seal ring comprises the remaining sides of the bypass ring.

18. The apparatus of claim 11, including one or more antennas conductively coupled to the RF transceiver.

19. A method of making an integrated circuit (IC) die, the method comprising:
  forming a seal ring using at least a portion of a plurality of metal layers of the IC die, wherein the seal ring is arranged around a perimeter of the IC die near an outer edge of the IC die;
  forming a first coil in the IC die; and
  forming a bypass conductor in at least one metal layer of the plurality of metal layers of the IC die and having a first end and a second end, wherein the first end and the second end of the bypass conductor are electrically connected to the seal ring, and the bypass conductor is arranged to form a bypass ring that comprises the bypass conductor and a portion of the seal ring.

20. The method of claim 19, including forming at least one of a second coil, a balun, and a transformer within the seal ring of the IC die and outside the bypass ring of the IC die.

21. The method of claim 19, including forming a conductive trace for electrical coupling to a clock circuit within the seal ring of the IC die and outside the bypass ring of the IC die.

22. The method of claim 19, including forming a local oscillator circuit of a radio frequency receiver in the IC die, wherein the local oscillator circuit includes the first coil as an inductor coil included in the local oscillator circuit.

23. The method of claim 19, including forming the seal ring in all metal layers of the plurality of metal layers and continuous around the outer edge of the IC die.

24. The method of claim 19, including forming the bypass conductor using one or more metal layers that are different from metal layers used to form the seal ring.

25. The method of claim 19, including forming the bypass conductor to have an impedance substantially equal to the impedance of a portion of the seal ring electrically coupled to the first end and the second end of the bypass conductor.

* * * * *